(12) United States Patent
Migita et al.

(10) Patent No.: US 9,190,373 B2
(45) Date of Patent: Nov. 17, 2015

(54) BUMP STRUCTURE WITH UNDERBUMP METALLIZATION STRUCTURE AND INTEGRATED REDISTRIBUTION LAYER

(75) Inventors: Tatsuo Migita, Oita (JP); Hirokazu Ezawa, Tokyo (JP); Soichi Yamashita, Kanagawa (JP); Masaya Shima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 13/222,332

(22) Filed: Aug. 31, 2011

(65) Prior Publication Data

US 2012/0049356 A1    Mar. 1, 2012

(30) Foreign Application Priority Data

Aug. 31, 2010   (JP) ................................. 2010-195026

(51) Int. Cl.
*H01L 23/48*     (2006.01)
*H01L 21/768*    (2006.01)
(Continued)

(52) U.S. Cl.
CPC .......... *H01L 24/11* (2013.01); *H01L 21/76885* (2013.01); *H01L 23/293* (2013.01); *H01L 23/3157* (2013.01); *H01L 24/03* (2013.01); *H01L 24/05* (2013.01); *H01L 24/13* (2013.01); *H01L 23/562* (2013.01); *H01L 2224/0235* (2013.01); *H01L 2224/0239* (2013.01); *H01L 2224/02331* (2013.01); *H01L 2224/03462* (2013.01); *H01L 2224/0401* (2013.01); *H01L 2224/05019* (2013.01); *H01L 2224/05022* (2013.01); *H01L 2224/05111* (2013.01); *H01L 2224/05116* (2013.01); *H01L 2224/05118* (2013.01); *H01L 2224/05147* (2013.01); *H01L 2224/05149* (2013.01);

(Continued)

(58) Field of Classification Search
CPC ... H01L 2224/94; H01L 23/293; H01L 24/05; H01L 24/13; H01L 2924/014
See application file for complete search history.

(56) References Cited

U.S. PATENT DOCUMENTS 6,489,229 B1 *   12/2002   Sheridan et al. ............. 438/614
6,605,522 B1 *    8/2003   Ezawa et al. ................. 438/613
(Continued)

FOREIGN PATENT DOCUMENTS

JP    2001-176904       6/2001
JP    2001-217310 A     8/2001
(Continued)

OTHER PUBLICATIONS

Combined Office Action and Search Report issued Nov. 29, 2013 in Chinese Patent Application No. 201110254765.4 with English translation and English translation of categories of cited documents.
(Continued)

*Primary Examiner* — Ori Nadav
*Assistant Examiner* — Ernest Allen, III
(74) *Attorney, Agent, or Firm* — Oblon, McClelland, Maier & Neustadt, L.L.P.

(57) ABSTRACT

According to one embodiment, a semiconductor substrate, a redistribution trace, and a surface layer are provided, with the surface layer provided on the redistribution trace. On the semiconductor substrate, a wire and a pad electrode are formed. The redistribution trace is formed on the semiconductor substrate. The surface layer is larger in width than the redistribution trace, and extends beyond the edge of the redistribution trace.

12 Claims, 7 Drawing Sheets

(51) Int. Cl.
*H01L 23/00* (2006.01)
*H01L 23/29* (2006.01)
*H01L 23/31* (2006.01)

(52) U.S. Cl.
CPC ............ *H01L 2224/05155* (2013.01); *H01L 2224/05157* (2013.01); *H01L 2224/05171* (2013.01); *H01L 2224/05181* (2013.01); *H01L 2224/05572* (2013.01); *H01L 2224/05582* (2013.01); *H01L 2224/05647* (2013.01); *H01L 2224/05666* (2013.01); *H01L 2224/05669* (2013.01); *H01L 2224/05671* (2013.01); *H01L 2224/05684* (2013.01); *H01L 2224/1147* (2013.01); *H01L 2224/11462* (2013.01); *H01L 2224/11849* (2013.01); *H01L 2224/13083* (2013.01); *H01L 2224/13099* (2013.01); *H01L 2224/13111* (2013.01); *H01L 2224/13144* (2013.01); *H01L 2224/13147* (2013.01); *H01L 2224/13155* (2013.01); *H01L 2224/94* (2013.01); *H01L 2924/00014* (2013.01); *H01L 2924/0103* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01024* (2013.01); *H01L 2924/01025* (2013.01); *H01L 2924/01029* (2013.01); *H01L 2924/01033* (2013.01); *H01L 2924/01046* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01)

(56) References Cited

U.S. PATENT DOCUMENTS

2002/0043723 A1* 4/2002 Shimizu et al. ............... 257/758
2003/0036260 A1   2/2003 Nakamura
2007/0184578 A1* 8/2007 Lin et al. ..................... 438/106

FOREIGN PATENT DOCUMENTS

| JP | 2003-60031 A | 2/2003 |
| JP | 2003-197665 | 7/2003 |
| JP | 2004-71942 | 3/2004 |
| JP | 2004-200420 | 7/2004 |
| JP | 2005-109110 | 4/2005 |
| JP | 2006-210406 A | 8/2006 |

OTHER PUBLICATIONS

Office Action issued Nov. 6, 2013 in Taiwanese Application No. 100128611 (With English Translation).
Japanese Office Action Issued Jan. 29, 2013 in Patent Application No. 2010-195026 (with English translation).
Japanese Office Action issued Sep. 10, 2013, in Japan Patent Application No. 2010-195026 (with English translation).
Office Action issued on Jul. 30, 2014 in the corresponding Chinese patent Application No. 201110254765.4 (with English Translation).
Office Action mailed Oct. 6, 2014 in Taiwanese Application No. 100128611 (w/English translation).
Office Action issued Dec. 22, 2014 in Chinese Application No. 201110254765.4 (w/English translation).
Office Action mailed May 22, 2015 in Chinese Application No. 201110254765.4 (w/English translation).

* cited by examiner

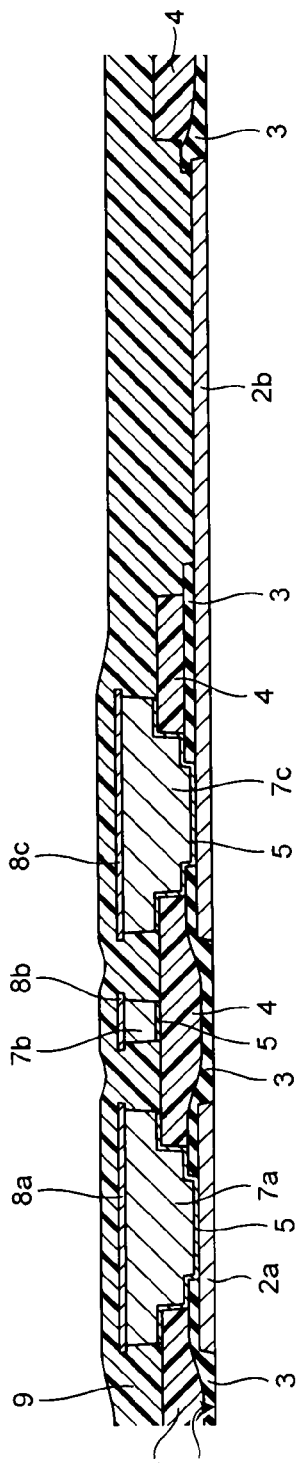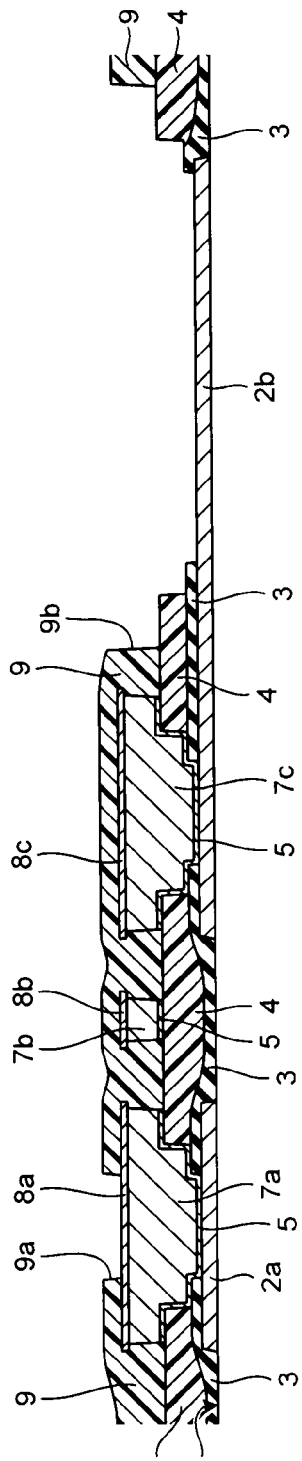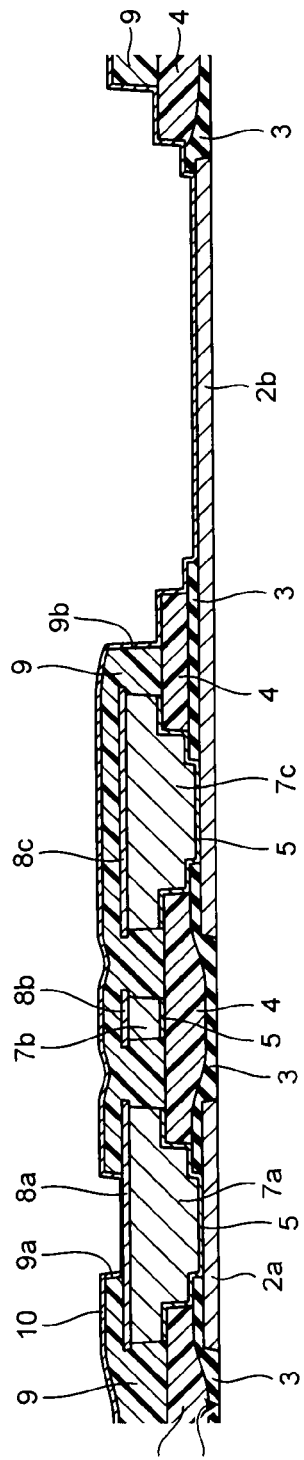

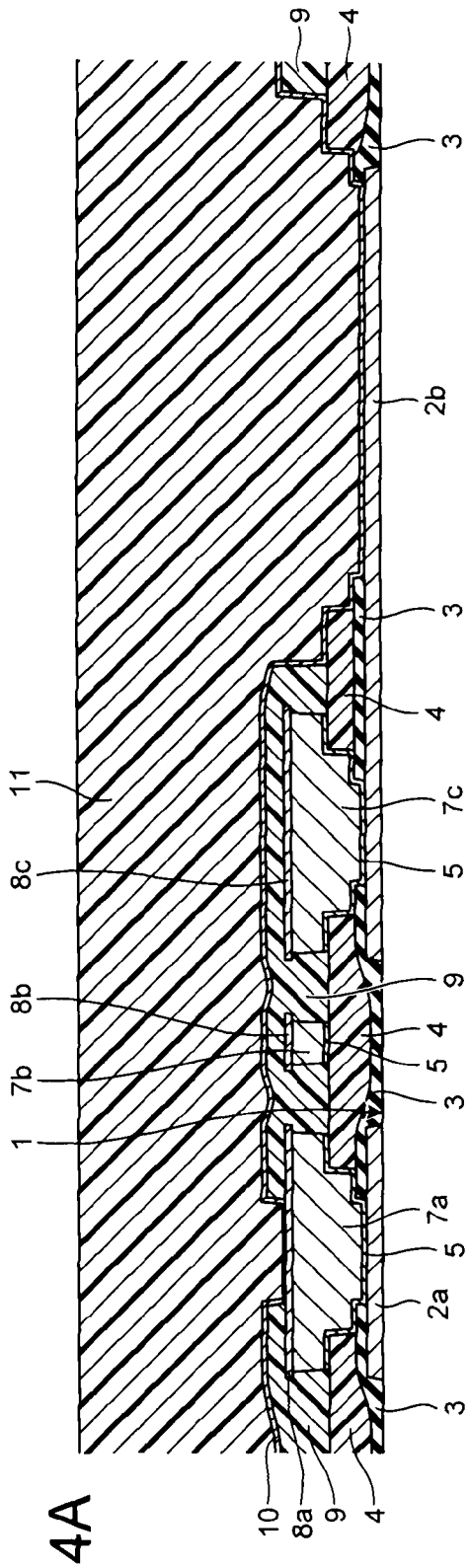
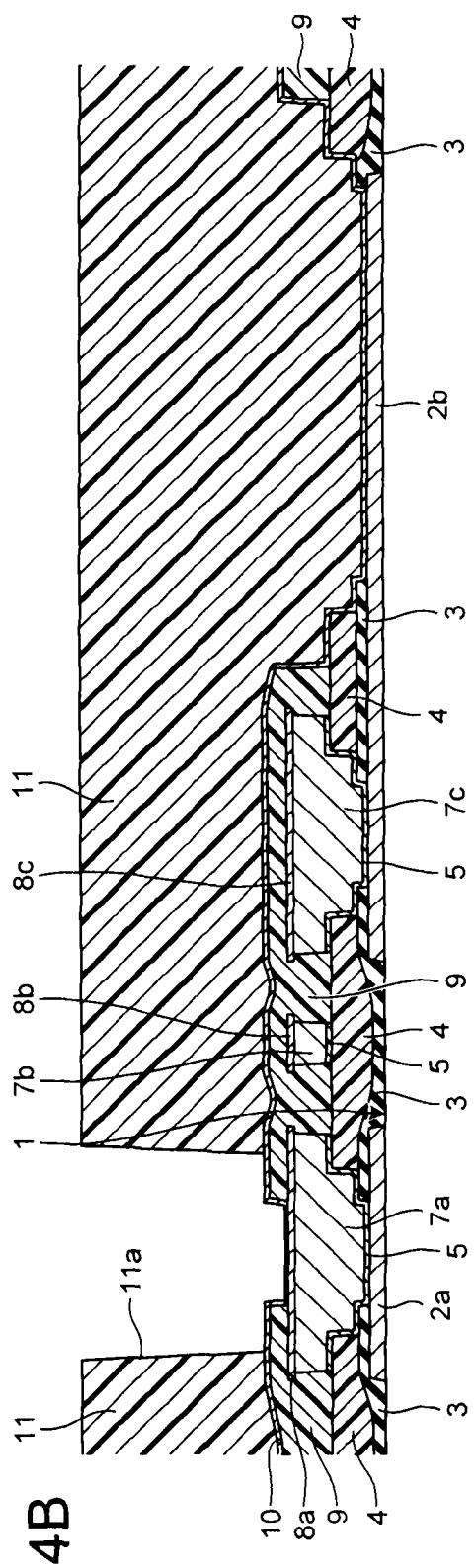
FIG.4A
FIG.4B

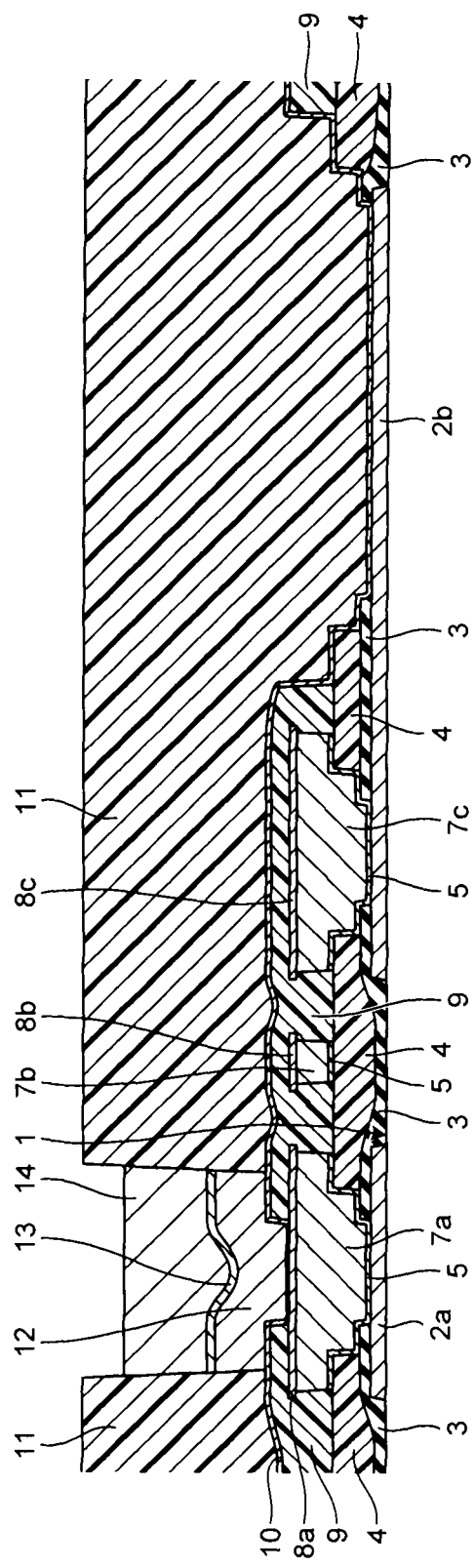
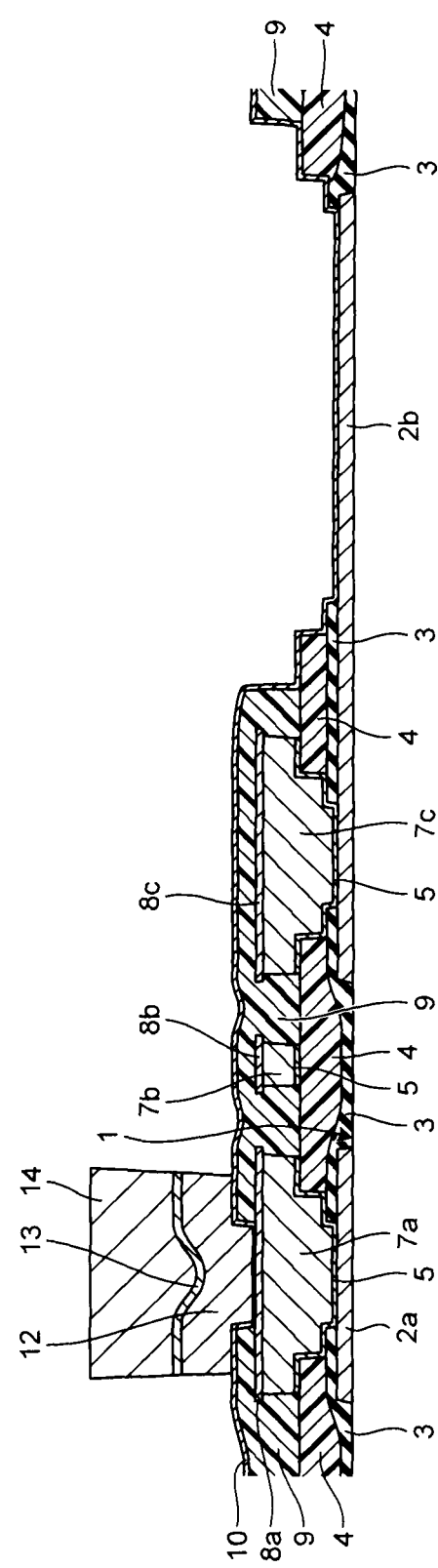
FIG. 5A
FIG. 5B

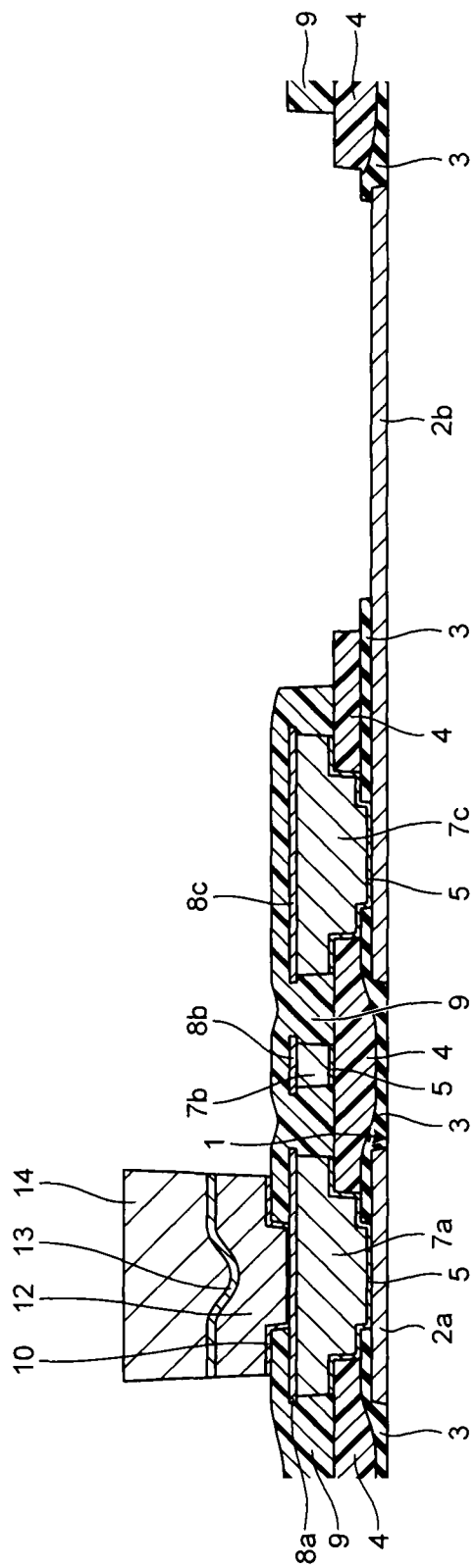
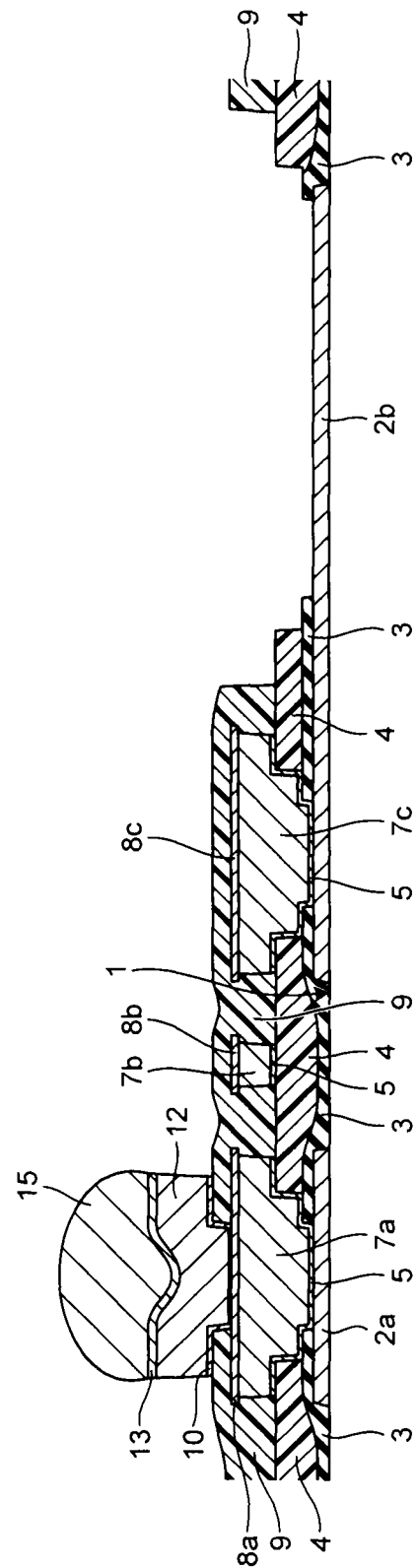

BUMP STRUCTURE WITH UNDERBUMP METALLIZATION STRUCTURE AND INTEGRATED REDISTRIBUTION LAYER

CROSS-REFERENCE TO RELATED APPLICATIONS

This application is based upon and claims the benefit of priority from the prior Japanese Patent Application No. 2010-195026, filed on Aug. 31, 2010; the entire contents of which are incorporated herein by reference.

FIELD

Embodiments described herein relate generally to a semiconductor device and a manufacturing method of a semiconductor device.

BACKGROUND

In order to achieve high integration and high performance of semiconductor devices, improvement of an operation speed and increase in capacity of memories are required. Accordingly, fine redistribution traces with a pitch of 10 um or less are required also in a redistribution trace forming process on a semiconductor substrate.

Scaling of a pitch of redistribution traces may result in occurrence of leakage between the redistribution traces. Moreover, a margin when further forming wires, bumps, or the like on the redistribution traces decreases, so that processing by photolithography has become difficult.

BRIEF DESCRIPTION OF THE DRAWINGS

FIG. 3A to FIG. 3C are cross-sectional views illustrating the manufacturing method of the semiconductor device according to the first embodiment;

FIG. 4A and FIG. 4B are cross-sectional views illustrating the manufacturing method of the semiconductor device according to the first embodiment;

FIG. 5A and FIG. 5B are cross-sectional views illustrating the manufacturing method of the semiconductor device according to the first embodiment;

FIG. 6A and FIG. 6B are cross-sectional views illustrating the manufacturing method of the semiconductor device according to the first embodiment.

DETAILED DESCRIPTION

In general, according to one embodiment, a semiconductor substrate, a redistribution trace, and a surface layer are provided. On the semiconductor substrate, a wire and a pad electrode are formed. The redistribution trace is formed on the semiconductor substrate. The surface layer is larger in width than the redistribution trace.

Exemplary embodiments of a semiconductor device and a manufacturing method of a semiconductor device will be explained below in detail with reference to the accompanying drawings. The present invention is not limited to the following embodiments.

First Embodiment

FIG. 1A to FIG. 1E, FIG. 2A to FIG. 2D, FIG. 3A to FIG. 3C, FIG. 4A and FIG. 4B, FIG. 5A and FIG. 5B, and FIG. 6A and FIG. 6B are cross-sectional views illustrating a manufacturing method of a semiconductor device according to the first embodiment.

Figures 1A, 1B, 1C, 1D, 1E:
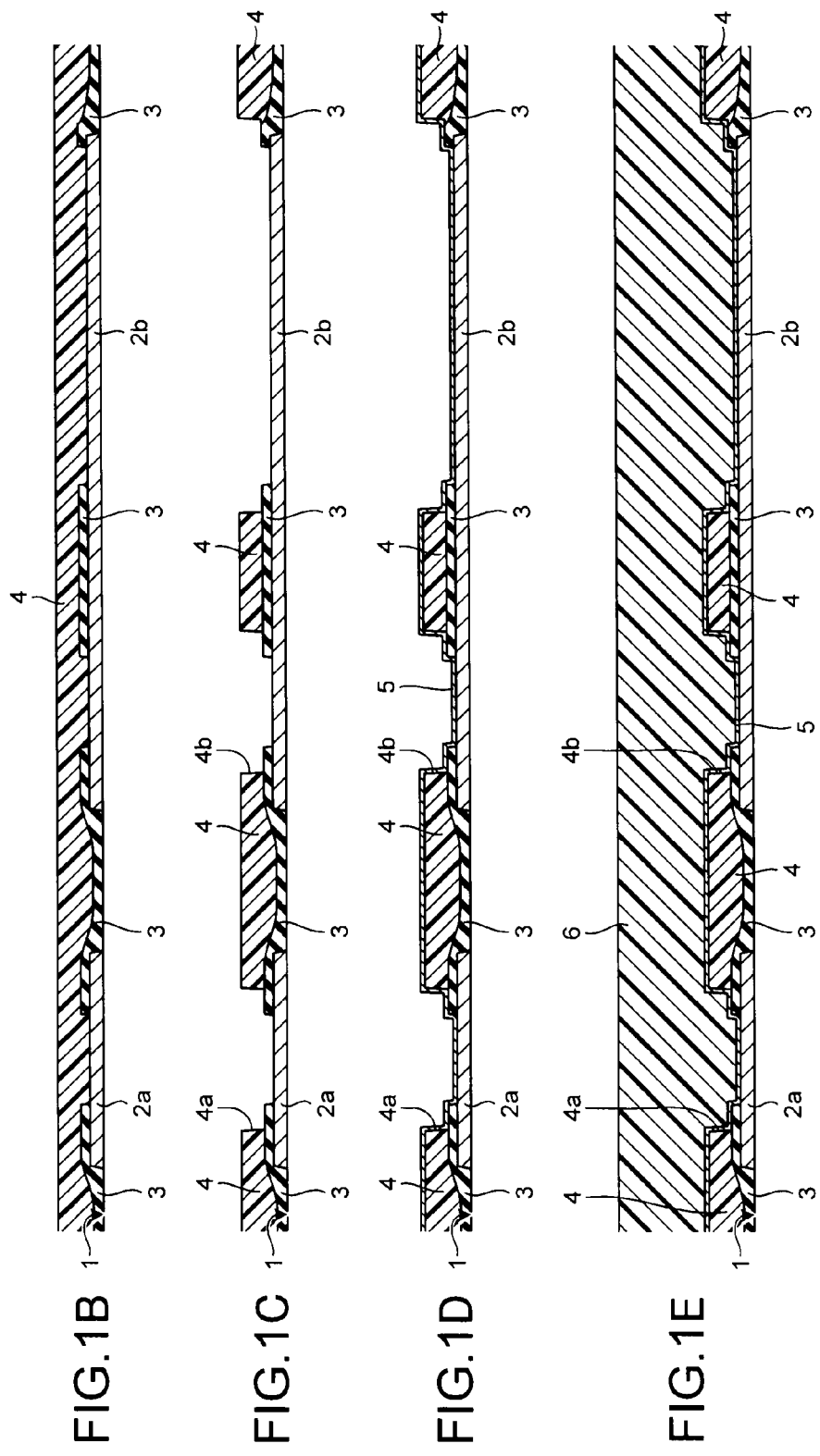
FIG. 1A to FIG. 1E are cross-sectional views illustrating a manufacturing method of a semiconductor device according to a first embodiment.

In FIG. 1A, on a base material layer 1, a pad electrode 2a and a wire 2b are formed and a protective film 3 is formed to cover the pad electrode 2a and the wire 2b. Moreover, in the protective film 3, an opening 3a that exposes the pad electrode 2a and an opening 3b that exposes part of the wire 2b are formed.

As the base material layer 1, for example, a semiconductor substrate on which an integrated circuit, such as a logic circuit or a DRAM, is formed can be used. Moreover, as the material of the pad electrode 2a and the wire 2b, for example, Al or Al-based metal can be used. Furthermore, as the material of the protective film 3, for example, an inorganic insulator, such as a silicon oxide film, a silicon oxynitride film, or a silicon nitride film, can be used.

Next, as shown in FIG. 1B, a first buffer layer 4 is formed on the protective film 3 by applying photosensitive resin or the like to the protective film 3. As the material of the first buffer layer 4, for example, polyimide resin can be used. For reducing wafer stress, it is applicable to use acrylic resin or phenolic resin whose curing temperature is lower than polyimide resin.

Next, as shown in FIG. 1C, openings 4a and 4b, which expose the pad electrode 2a and part of the wire 2b, respectively, are formed in the first buffer layer 4 by using the photolithography technology.

Next, as shown in FIG. 1D, an under barrier metal film 5 is formed on the pad electrode 2a, the wire 2b, the protective film 3, and the first buffer layer 4 by using a method such as sputtering, plating, CVD, ALD, or vapor deposition. As the under barrier metal film 5, for example, a stacked structure of Ti and Cu stacked thereon can be used. It is applicable to use a material such as TiN, TiW, W, Ta, Cr, or Co instead of Ti. Moreover, it is applicable to use a material such as Al, Pd, Au, or Ag instead of Cu.

Next, as shown in FIG. 1E, a resist film 6 is formed on the under barrier metal film 5 by using a method such as spin coating.

Figures 2A, 2B, 2C, 2D:
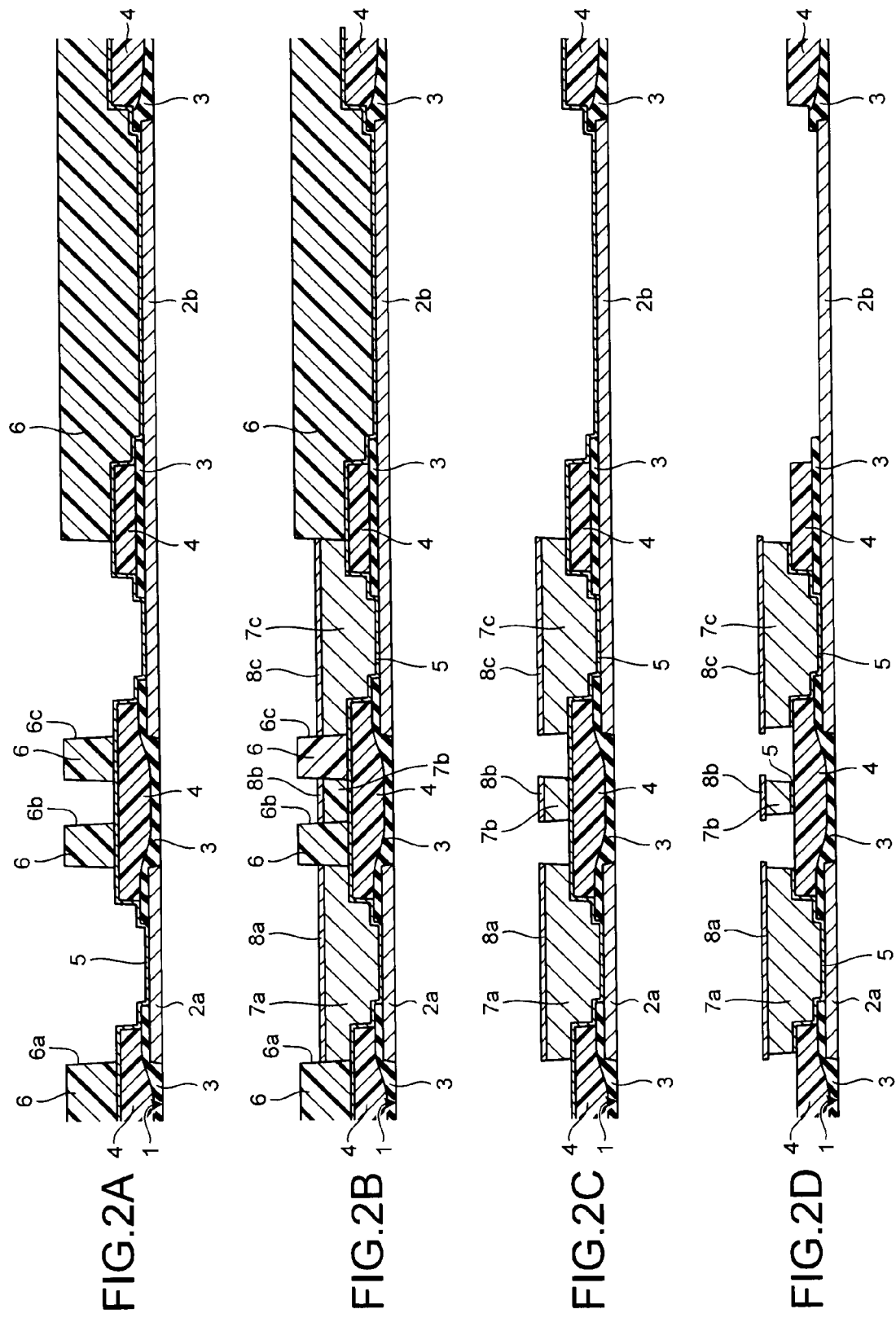
FIG. 2A to FIG. 2D are cross-sectional views illustrating the manufacturing method of the semiconductor device according to the first embodiment.

Next, as shown in FIG. 2A, openings 6a to 6c are formed in the resist film 6 by performing exposure and development on the resist film 6. The opening 6a can be arranged over the pad electrode 2a, the opening 6b can be arranged over the first buffer layer 4, and the opening 6c can be arranged over the wire 2b.

Next, as shown in FIG. 2B, redistribution traces 7a to 7c are formed on the pad electrode 2a, the first buffer layer 4, and the wire 2b, respectively, via the under barrier metal film 5 by embedding a first conductor in the openings 6a to 6c by electroplating. Moreover, surface layers 8a to 8c are formed on the redistribution traces 7a to 7c, respectively, by embedding a second conductor in the openings 6a to 6c by electroplating. The redistribution trace 7a can be used for connection with the pad electrode 2a. The redistribution trace 7c can be used for connection with the wire 2b. The redistribution trace 7b can be used, for example, for routing the redistribution trace 7a and 7c on the first buffer layer 4.

For the surface layers 8a to 8c, a material having a higher etch resistance than the redistribution traces 7a to 7c can be used and the etch selectivity of the redistribution traces 7a to 7c with respect to the surface layers 8a to 8c is desirably one or more. For example, the material of the redistribution traces 7a to 7c can be Cu or Cu-based metal, and the material of the surface layers 8a to 8c can be selected from at least any one of Ni, Mn, Ta, Zn, Cr, Co, Sn, and Pb. Moreover, desirably, the width of the redistribution traces 7a to 7c is 60 μm or less, preferably 40 μm or less, and more preferably 20 μm or less.

Next, as shown in FIG. 2C, the resist film 6 on the under barrier metal film 5 is removed by a method such as ashing.

Next, as shown in FIG. 2D, the redistribution traces 7a to 7c are thinned to be smaller in width than the surface layers 8a to 8c by etching the side surfaces of the redistribution traces 7a to 7c.

Etching of the side surfaces of the redistribution traces 7a to 7c can be facilitated compared with the surface layers 8a to 8c by using the material having a higher etch resistance than the redistribution traces 7a to 7c for the surface layers 8a to 8c. Therefore, the surface layers 8a to 8c can be formed on the redistribution traces 7a to 7c to protrude from the redistribution traces 7a to 7c in the width direction along the redistribution traces 7a to 7c, respectively.

At this time, it is applicable to remove the under barrier metal film 5 around the redistribution traces 7a to 7c by etching the under barrier metal film 5 concurrently with etching of the side surfaces of the redistribution traces 7a to 7c. Therefore, the surface layers 8a to 8c preferably have an etch ratio also with respect to the under barrier metal film 5.

Next, as shown in FIG. 3A, a second buffer layer 9 is formed on the wire 2b, the first buffer layer 4, and the surface layers 8a to 8c by applying photosensitive resin or the like to the wire 2b, the first buffer layer 4, and the surface layers 8a to 8c. As the material of the second buffer layer 9, for example, polyimide resin can be used. For reducing wafer stress, it is applicable to use acrylic resin or phenolic resin whose curing temperature is lower than polyimide resin.

Next, as shown in FIG. 3B, openings 9a and 9b, which expose the surface layer 8a on the pad electrode 2a and part of the wire 2b, respectively, are formed in the second buffer layer 9 by using the photolithography technology.

Next, as shown in FIG. 3C, an under barrier metal film 10 is formed on the wire 2b, the protective film 3, and the buffer layers 4 and 9, and the surface layer 8a by using a method such as sputtering, plating, CVD, ALD, or vapor deposition. As the under barrier metal film 10, for example, a stacked structure of Ti and Cu stacked thereon can be used.

Next, as shown in FIG. 4A, a resist film 11 is formed on the under barrier metal film 10 by using a method such as spin coating.

Next, as shown in FIG. 4B, an opening 11a, which exposes the surface layer 8a on the pad electrode 2a, is formed in the resist film 11 by performing exposure and development on the resist film 11.

Next, as shown in FIG. 5A, a bump electrode is formed on the surface layer 8a via the under barrier metal film 10 by sequentially embedding a barrier layer 12 and solder layers 13 and 14 in the opening 11a by electroplating. For example, Ni can be used for the material of the barrier layer 12, Cu can be used for the material of the solder layer 13, and Sn can be used for the material of the solder layer 14.

Next, as shown in FIG. 5B, the resist film 11 on the under barrier metal film 10 is removed by a method such as ashing.

Next, as shown in FIG. 6A, the under barrier metal film 10 is etched with the bump electrode formed of the barrier layer 12 and the solder layers 13 and 14 as a mask, thereby removing the under barrier metal film 10 around the bump electrode formed of the barrier layer 12 and the solder layers 13 and 14.

Next, as shown in FIG. 6B, the solder layers 13 and 14 are reflowed, so that the solder layers 13 and 14 are alloyed to form a bump electrode formed of an alloy solder layer 15 on the barrier layer 12.

The above processes can be performed in a state where the base material layer 1 is a wafer. Then, after the above processes, semiconductor chips can be cut out by singulating this wafer.

The pitch of the redistribution traces 7a to 7c can be reduced while suppressing leakage between the redistribution traces 7a to 7c by thinning the redistribution traces 7a to 7c, and moreover, a margin when forming the opening 9a over the redistribution trace 7a can be increased by forming the surface layers 8a to 8c, whose width is larger than the redistribution traces 7a to 7c, on the redistribution traces 7a to 7c, respectively.

Moreover, increase in the number of processes can be suppressed by thinning the redistribution traces 7a to 7c concurrently with etching and removing of the under barrier metal film 5 around the redistribution traces 7a to 7c.

In the above embodiment, the method of using a solder ball as the bump electrode is explained, however, a nickel bump, a gold bump, a copper bump, or the like can be used instead. Moreover, in the above embodiment, explanation is given for the method of using a stacked structure of Ti and Cu as the under barrier metal films 5 and 10, however, Ti or Cu can be used alone, Cr, Pt, W, or the like can be used alone, or a stacked structure of these metals can be used.

Furthermore, as a joining method of the bump electrode, metal joint, such as solder joint and alloy joint, can be used, or ACF (Anisotropic Conductive Film) bonding, NCF (Nonconductive Film) bonding, ACP (Anisotropic Conductive Paste) bonding, NCP (Nonconductive Paste) bonding, or the like can be used.

Second Embodiment

Figure 7:
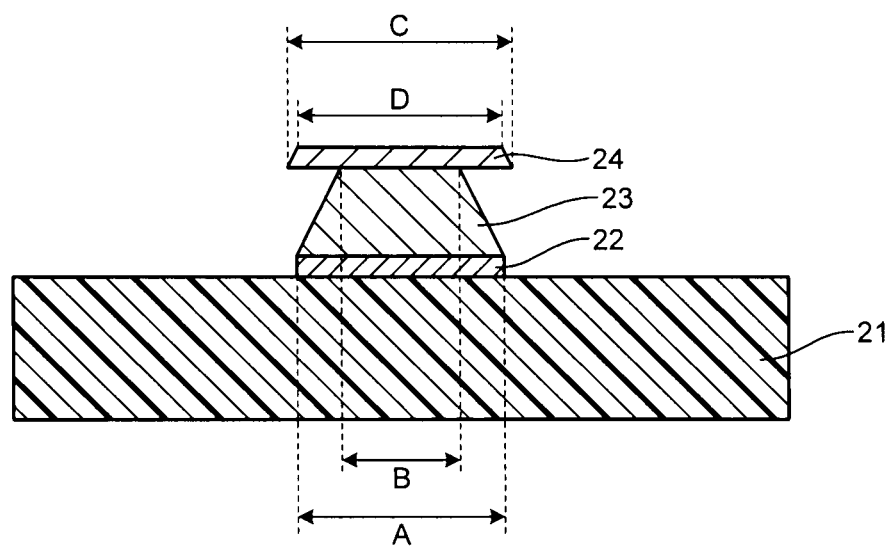
FIG. 7 is a cross-sectional view illustrating a schematic configuration of a semiconductor device according to a second embodiment.

FIG. 7 is a cross-sectional view illustrating a schematic configuration of a semiconductor device according to the second embodiment.

In FIG. 7, a redistribution trace 23 is formed on a buffer layer 21 via an under barrier metal film 22 and a surface layer 24 is formed on the redistribution trace 23.

As the material of the buffer layer 21, for example, polyimide resin can be used. For reducing wafer stress, it is applicable to use acrylic resin or phenolic resin whose curing temperature is lower than polyimide resin. As the under barrier metal film 22, for example, a stacked structure of Ti and Cu stacked thereon can be used. It is applicable to use a material such as TiN, TiW, W, Ta, Cr, or Co instead of Ti. Moreover, it is applicable to use a material such as Al, Pd, Au, or Ag instead of Cu.

For the surface layer 24, a material having a higher etch resistance than the redistribution trace 23 can be used. For example, the material of the redistribution trace 23 can be Cu, and the material of the surface layer 24 can be selected from at least any one of Mn, Ta, Ni, Zn, Cr, Co, Sn, and Pb.

The cross section of the redistribution trace 23 can have a trapezoidal shape in which a top width B is smaller than a bottom width A. The cross section of the surface layer 24 can have a trapezoidal shaped in which a top width D is smaller than a bottom width C. In order to make the cross section of the redistribution trace 23 and the surface layer 24 have a trapezoidal shape, the cross section of the resist opening in which the redistribution trace 23 and the surface layer 24 are embedded can have an inverted trapezoidal shape.

The width of the surface layer 24 is set to be larger than the bottom width A of the redistribution trace 23. Moreover, it is preferable to satisfy the relationship |A−B|>|C−D|. For example, it is possible to set the thickness of the redistribution trace 23 to 5 μm, the bottom width A to 4 μm, and the top width B to 3 μm. It is possible to set the thickness of the surface layer 24 to 0.1 μm, the bottom width C to 5 μm, and the top width D to 4.98 μm. At this time, |A−B| is 1 μm and |C−D| is 0.02 μm.

The cross section of the redistribution trace 23 has a trapezoidal shape in which the top width B is smaller than the bottom width A, so that adhesive strength between the redistribution trace 23 and the base thereof can be increased, enabling to thinning the redistribution trace 23 while suppressing stripping of the redistribution trace 23.

Moreover, the width of the surface layer 24 is set to be larger than the bottom width A of the redistribution trace 23, so that it is possible to make the redistribution trace 23 invisible by the surface layer 24 when viewed from the top. Therefore, even when variation occurs in a tilt angle of the side surface of the redistribution trace 23 in a wafer plane or between wafers, luminance of reflected light when emitting light from the top can be uniformed. Thus, even when an appearance inspection or a dimension measurement is performed by using such reflected light, it is possible to reduce erroneous detection of determining a quality product to be defective and erroneous measurement due to misrecognition of a wire edge, so that the accuracy in quality control can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor substrate on which a wire and a pad electrode are formed;
    a redistribution trace formed on the semiconductor substrate;
    a surface layer provided on the redistribution trace and having a width which is larger than a width of the redistribution trace, a material of the surface layer being different from a material of the redistribution trace;
    a protective film formed on the semiconductor substrate to cover the wire and the pad electrode;
    a first opening that is formed in the protective film and exposes the pad electrode;
    a second opening that is formed in the protective film and exposes part of the wire;
    a first buffer layer formed on the protective film;
    a third opening that is formed in the first buffer layer and exposes the pad electrode through the first opening;
    a fourth opening that is formed in the first buffer layer and exposes part of the wire through the second opening; and
    a first under barrier metal film formed between the first buffer layer and the redistribution trace, wherein the protective film is inorganic insulator and the first buffer layer is resin;
    said redistribution trace including,
        a first redistribution trace connected to the pad electrode through the first opening and the third opening,
        a second redistribution trace connected to the wire through the second opening and the fourth opening, and
        a third redistribution trace formed on the first buffer layer;
    said semiconductor device further comprising,
    a second buffer layer in contact with the first redistribution trace, the second redistribution trace, and the third redistribution trace;
    a fifth opening that is formed in the second buffer layer and exposes a surface layer of the first redistribution trace; and
    a bump electrode connected to the surface layer of the first redistribution trace through the fifth opening, and wherein the second buffer layer contacts side surfaces of the first under barrier metal film, the redistribution trace and the surface layer.

2. The semiconductor device according to claim 1, wherein etch selectivity of the redistribution trace as compared to the surface layer is one or more in an etching process of the redistribution trace.

3. The semiconductor device according to claim 1, wherein a material of the redistribution trace is Cu and a material of the surface layer is selected from at least any one of Mn, Ta, Ni, Zn, Cr, Co, Sn and Pb.

4. The semiconductor device according to claim 1, wherein the redistribution trace is such that a top width is smaller than a bottom width.

5. The semiconductor device according to claim 4, wherein a width of the surface layer is larger than the bottom width of the redistribution trace.

6. The semiconductor device according to claim 1, wherein an integrated circuit is formed on the semiconductor substrate.

7. The semiconductor device according to claim 1, wherein the resin is selected from polyimide resin, acrylic resin, and phenolic resin.

8. The semiconductor device according to claim 1, wherein the bump electrode is formed of an alloy solder layer.

9. The semiconductor device according to claim 1, further comprising a second under barrier metal film formed between the second buffer layer and the bump electrode.

10. The semiconductor device according to claim 9, wherein the second buffer layer is resin.

11. The semiconductor device according to claim 10, wherein the resin is selected as one of the collection of polyimide resin, acrylic resin, and phenolic resin.

12. The semiconductor device according to claim 1, wherein a diameter of the bump electrode is larger than a top width of the third redistribution trace.

* * * * *